US006926536B2

(12) United States Patent
Ochiai

(10) Patent No.: US 6,926,536 B2
(45) Date of Patent: Aug. 9, 2005

(54) CONTACT SHEET AND SOCKET INCLUDING SAME

(75) Inventor: Toshimasa Ochiai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/732,661

(22) Filed: Dec. 10, 2003

(65) Prior Publication Data

US 2004/0127073 A1 Jul. 1, 2004

(30) Foreign Application Priority Data

Dec. 27, 2002 (JP) ....................................... 2002-381617
Oct. 21, 2003 (JP) ....................................... 2003-361141

(51) Int. Cl.[7] ........................... H01R 12/00; H05K 1/00
(52) U.S. Cl. ........................... 439/66; 439/91; 439/591
(58) Field of Search ............................ 439/66, 91, 591

(56) References Cited

U.S. PATENT DOCUMENTS

| | | | | |
|---|---|---|---|---|
| 5,173,055 A | * 12/1992 | Grabbe | 439/66 |
| 5,297,967 A | * 3/1994 | Baumberger et al. | 439/66 |
| 6,293,808 B1 | * 9/2001 | Ochiai | 439/70 |
| 6,328,573 B1 | 12/2001 | Sakata et al. | 439/66 |
| 6,375,474 B1 | * 4/2002 | Harper et al. | 439/66 |
| 6,474,997 B1 | * 11/2002 | Ochiai | 439/70 |
| 6,719,569 B2 | * 4/2004 | Ochiai | 439/66 |
| 2002/0055282 A1 | * 5/2002 | Eldridge et al. | 439/66 |

* cited by examiner

*Primary Examiner*—Hae Moon Hyeon
(74) *Attorney, Agent, or Firm*—Burr & Brown

(57) ABSTRACT

A contact sheet is provided including two insulative base sheets having a plurality of through-holes formed therethrough in an array pattern and a plurality of conductive contacts interposed between the insulative base sheets. Each contact includes a fixed part bonded to an end of a respective through-hole and an integral moving part contiguous with the fixed part. The moving part includes a contact portion formed as an elastic cantilever. Part of the moving part protrudes from one side of the base sheet inside the through-hole and the contact portion elastically extends from the other side of the base sheet. The total area of the through-hole and the fixed part of the contact is greater than a unit grid area formed by an arrangement of the terminals of an electronic device, and the length of the moving part, including the contact portion, substantially corresponds to the overall length of the through-hole.

7 Claims, 12 Drawing Sheets

CONTACT SHEET AND SOCKET INCLUDING SAME

This application claims the benefit of Japanese Application Nos. 2002-381617, filed Dec. 27, 2002, and 2003-361141, filed Oct. 21, 2003, the entireties of which are incorporated herein by reference.

FIELD OF THE INVENTION

The present invention relates to a contact sheet that is used for providing an electrical connection between electronic devices, such as integrated circuits, cables, and printed circuit boards, whose terminals are arranged on an edge part or in a grid pattern, methods of manufacturing such a contact sheet and a socket using the contact sheet.

BACKGROUND OF THE INVENTION

A contact sheet is put between electronic devices, such as integrated circuits, cables, and printed circuit boards, and is used to connect terminals of electric devices in order to shorten the length of electrical path and to reduce the resistance between them. Such a contact sheet is composed of conductive contacts that are arranged on edge part of a package or in a grid pattern on a base sheet. Generally, each contact is fixed on the base sheet. The portion of the contact that contacts the terminal is elasticized and extends a distance above or below the base sheet and elastically contacts the terminal of the electronic device to make an electrical connection.

In recent years, because of the demand for high-density pin-arrangements and installing a large number of pins, the lead pitch in electronic devices is becoming increasingly finer. Even in these cases, it is required that the contacts provide a stable electronic connection with respect to displacement and load. In accordance with this requirement, the size of the contact has been reduced so far.

However, according to this former way, the shorter the length of the contact is, the smaller the displacement length becomes, and it is impossible to absorb any warp caused during contact with the electronic device. If, however, the contact length is preserved by instead reducing the width or the thickness of the contact (in order to maintain sufficient displacement length), a sufficient contact load between the terminal and the contact cannot be ensured.

For the above-mentioned reasons, a contact having a spiral structure was developed. Both ends of the contact are positioned between base sheets and supported by therein, and a part of the contact that connects to the terminal is formed as a spiral in the vertical direction of the base sheet (U.S. Pat. No. 5,297,967). Although the contact sheet according to U.S. Pat. No. 5,297,967 can absorb the warp of the electronic device due to the sufficient displacement length of its contact connecting part, the resistance increases, however, and the contact load tends to be small. As a result, the electrical resistance becomes larger as a whole and it is difficult to decrease the circuit inductance and increase the operation speed.

Furthermore, a structure was developed wherein both ends of the contact are positioned between base sheets and an intermediate part of the contact is twisted, extending from the upper and lower surface of the base sheets, and formed into a connecting part (U.S. Pat. No. 6,328,573 B1). In the case of the contact sheet according to U.S. Pat. No. 6,328,573 B1, however, even if the connecting part is twisted, the electrical resistance is increased along with the displacement length.

SUMMARY OF THE INVENTION

The present invention has been made in view of solving the above problems, and an object thereof is to provide a contact sheet and manufacturing method thereof that is fully applicable to electronic devices having a finer lead pitch by providing contacts with a sufficient displacement length comparable to that of contacts arranged at a larger pitch and that reduces the electrical resistance of the connection.

In order to attain the above-mentioned purposes, according to a first embodiment of the present invention, a contact sheet for providing an electrical connection between terminals of two or more electronic devices is provided between the electronic devices. The contact sheet comprises two insulative base sheets having a plurality of through-holes formed therethrough in an arrayed pattern and a plurality of conductive contacts interposed between the insulative base sheets which provide an electrical connection between the terminals of the electronic devices. Each conductive contact comprises a first part that is fixed to an end or edge portion of a through-hole, and a second part that is contiguous with and immediately adjacent the fixed first part. The contact also includes an integral third contact portion which is contiguous with the first and second parts and immediately adjacent the second part and formed as an elastic cantilever. The second part positioned within the through-hole extends from one side of the base sheet and the contact portion extends away from the second part and is elastically raised from the other side of the base sheet. The total area of the through-hole and the fixed part is greater than a unit grid area formed by an arrangement of terminals of the electronic device, such as a square arrangement or a rectangular arrangement, for example, and a total length of the second part and the third contact portion of the contact substantially corresponds to the length of the through-hole. Each fixed part of each contact is bonded to an upper or a lower surface of each base sheet so as to be positioned in a substantially coplanar arrangement between the two base sheets.

According to the above embodiment of the present invention, the contact portion that extends away from the second part contacts and conducts electricity to a terminal of an electronic device.

Because the total area of the fixed part of the contact and through-hole of the base sheet is greater than the unit grid area formed by an arrangement of terminals of the electronic device, the through-hole can be configured to be relatively large and the length of the moving part, including the second part and the contact portion, substantially corresponds to the overall length of the through-hole. Therefore, the contact portion can be lengthened and sufficient bending displacement can be ensured. Accordingly, even if the terminal pitch of the electronic device is narrow, the contact portion can be sufficiently bent, can absorb the deformation, and can maintain sufficient contact with the terminal of the electronic device.

Furthermore, because the total area of the fixed part and the through-hole is greater than the square measure of the unit grid, and because the fixed part can be configured to be large, it is possible to impart a large elasticity to the contact portion supported by the fixed part. Therefore, the contact load between the contact portion and the terminal of the electronic device can be increased, the electrical resistance can be reduced, and higher speeds and a reduced inductance for the electronic devices can be achieved.

According to a second embodiment of the present invention, a contact sheet according to the first embodiment is provided, wherein the total area of the fixed part of the contact and the through-hole is an integral multiple of the unit grid area formed by an arrangement of the terminals. Accordingly, this contact sheet also is satisfactorily applicable to the terminals of electronic devices.

According to a third embodiment of the present invention, a contact sheet according to the first embodiment is provided, wherein more than two contacts are arranged adjacent each other in a single through-hole. Because two through-holes are effectively combined in the width direction and made into one, the width of the through-hole is effectively doubled. Accordingly the spring load can be enlarged and a more stable electrical connection is ensured.

According to a fourth embodiment of the present invention, a contact sheet is provided by bonding two contact sheets according to first embodiment together back to back. According to this aspect of the invention, in addition to the effects of aforementioned three embodiments, when the two contact sheets are bonded back to back such that the contact portions extend from an upper and a lower surface of the contact sheet, the connecting length of the contact portions is effectively doubled. Therefore, even if the pitch of contacts becomes closer or the distance between two electronic devices is larger, sufficient displacement is ensured and a sufficient connection between terminals of electronic devices can be maintained.

According to a fifth embodiment of the present invention, a method for producing a contact sheet for providing an electrical connection between the terminals of two or more electronic devices by positioning the contact sheet between the electronic devices is provided.

According to this method, an insulative base sheet is provided having a plurality of through-holes formed therein in an array pattern. Preferably, the number of through-holes is less than the number of terminals on the electronic device.

A metal contact sheet is provided comprising a plurality of conductive contacts. Each of the contacts comprises a first fixed part and a contiguous moving part, including an integral second part immediately adjacent the first part and an integral third contact portion immediately adjacent the second part. The total area of the fixed part and the through-hole is greater than a unit grid area formed by an arrangement of the terminals of the electronic device, and the length of the moving part substantially corresponds to the overall length of the through-hole.

The metal contact sheet and at least one base sheet are arranged so that each fixed part of each contact is located in a part of the area surrounding a respective through-hole and then bonded to form a bonded sheet.

The bonded sheet is pressed to bend the second part of the contact to protrude from one side of the bonded sheet and such that the contact portion elastically extends a distance from the other side of the bonded sheet.

Two or more of the bonded sheets are stacked and arranged in an offset position such that a portion of the respective through-holes of the bonded sheets overlap and so that all of the contact portions extend from the same side of the stacked bonded sheets and are arranged in a position corresponding to the terminals of the electronic device. The arranged bonded sheets are then bonded to form a contact sheet.

According to this embodiment of the present invention, the total area of the fixed part and the through-hole is greater than the square measure of the unit grid, and the length of the moving part, including the second part and the third contact portion, is configured to substantially correspond to the overall length of the through-hole. This structure allows the contact portion to be long while accommodating a finer lead pitch. Accordingly, the displacement of the contact portion can be ensured, the contact load to the terminals can be increased and the electrical resistance is reduced.

According to a sixth embodiment of the present invention, a contact sheet is provided that is produced by bonding two of the contact sheets according to the fifth embodiment back to back to each other. In addition to the advantageous effects of the above embodiments, the effective length of the contact portion can be doubled by bonding two contact sheets back to back, sufficient displacement of each contact portion is ensured even if the terminal pitch is relatively small and the distance between electronic devices is relatively large, and the contact portion effectively conducts between corresponding terminals on each electronic device.

According to a seventh embodiment of the present invention, a method for producing a contact sheet for providing an electrical connection between the terminals of two or more electronic devices by positioning the contact sheet between the electronic devices is provided. The method includes the steps of providing a first insulative base sheet having a smaller number of first through-holes than the number of terminals of the electronic device formed therein in an arrayed pattern and providing a second insulative base sheet having a plurality of second through-holes formed therein in an arrayed pattern corresponding to the number of terminals. A metal sheet is formed into a metal contact sheet comprising a plurality of conductive contacts. Each conductive contact comprises a first fixed part which corresponds to a part of the area surrounding a respective one of the first through-holes. The total area of the fixed part and a respective first through-hole is greater than the unit grid area formed by an arrangement of the terminals of the electronic device. The contact also includes a moving part including an integral second part that is contiguous with and immediately adjacent the fixed part and an integral third contact portion that is contiguous with and immediately adjacent the second part. The moving part has a length substantially corresponding to the overall length of the first through-hole. The first base sheet and the metal contact sheet are arranged such that each fixed part corresponds to a part of the area surrounding a respective first through-hole and each moving part is located in a position corresponding to a respective first through-hole, and the first base sheet and metal contact sheet are bonded to form a bonded sheet.

Each moving part is bent so that the second part protrudes from one side of the bonded sheet and such that the third contact portion elastically extends a distance from the other side of the bonded sheet such that the third contact portion works as an elastic spring contact. The bonded sheet is cut into a plurality of individual contact units that comprise a plurality of contacts, and a plurality of the contact units are arranged side by side on the second base sheet so that the contact portions of each contact unit are located on the same side of the second base sheet and correspond to a respective terminal of the electronic device. The contact units and the second base sheet are bonded together to form a contact sheet.

According to this embodiment of the present invention, since the total area of the fixed part and the first through-hole is greater than the unit grid area, the length of the contact portion can be increased while the contact portions can also be positioned in close intervals, which is applicable to fine lead pitch devices. Furthermore, by arranging the contact units and bonding them to the second base sheet, it is possible to produce a contact sheet with contact portions that have sufficient displacement and which contact the terminals of the electronic device with a small resistance.

According to an eighth embodiment of the present invention, a method is provided for producing a contact sheet that comprises a step of bonding at least two contact sheets according to the seventh embodiment back to back to each other. According to this embodiment of the invention, in addition to the operation of the above seventh embodiment, contact sheets are provided wherein the contact portions protrude from both sides thereof by bonding the two contact sheets together back to back. Thus, the contact sheet effectively conducts between the corresponding terminals of each electronic device.

According to a ninth embodiment of the present invention, a socket is provided wherein a contact sheet according to the first to fourth embodiments is configured inside a frame. The socket in accordance with this embodiment includes contact portions that have sufficient displacement and which securely contact the terminals of an electronic device that has a fine lead pitch. Moreover, since the frame reinforces the contact sheet, the contact sheet has wear resistance and endurance for repetitive uses.

BRIEF DESCRIPTION OF THE DRAWINGS

For a better understanding of the nature and objects of the present invention, reference should be made to the following detailed description of a preferred mode of practicing the invention, read in connection with the accompanying drawings, in which:

FIG. 6(*b*) shows the state after bonding in accordance with the first embodiment;

DETAILED DESCRIPTION OF THE INVENTION

A contact sheet according to one embodiment of the present invention comprises two base sheets and a plurality of contacts. An insulative material, which is selected from heat-resistant resins such as silicone rubber, synthetic rubber, or polyimide, is used as the material for the base sheet. Polyimide is preferable from the point of view of workability and durability, for example. The thickness of the sheet is selected to be in a range of 10 to 100 μm, preferably in a range of 25 to 75 μm. If the thickness is less than 10 μm, drilling or handling is difficult and if the thickness is more than 100 μm, the width of the sheet after drilling is less than the thickness and it is not suitable for a finer terminal pitch. Moreover, a sheet that has a thickness in a range of 25 to 75 μm can be obtained as a standard product, and production costs are cheaper.

The contacts each comprise a first fixed part to be fixed to the base sheet, and a moving part including a second part and a third contact portion, wherein the second part adjoins the fixed part and the contact portion. The contact portion elastically extends from the second part as a cantilever, contacts a terminal of an electronic device and provides an electrical connection with a terminal of the electronic device. A conductive material which has high fatigue resistance and elasticity, such as beryllium-copper or beryllium-nickel, is preferably used as a material for the contact. The thickness of the contact is suitably in a range of 5 to 100 μm, and preferably in a range of 15 to 85 μm.

If the thickness of the contact is less than 5 μm, processing and handling are difficult, and if the thickness is more than 100 μm, fine etching processing is impossible and a fine terminal pitch cannot be provided. Specifically, if the contact thickness is less than 15 μm, the spring load required to ensure a suitable connection is not provided, and if the contact thickness is more than 85 μm, sufficient spring displacement is not provided and the contact load also becomes so large that the contact is not suitable as a spring.

Hereafter, the embodiments in accordance with the present invention that are shown in figures are explained.

Figure 3:
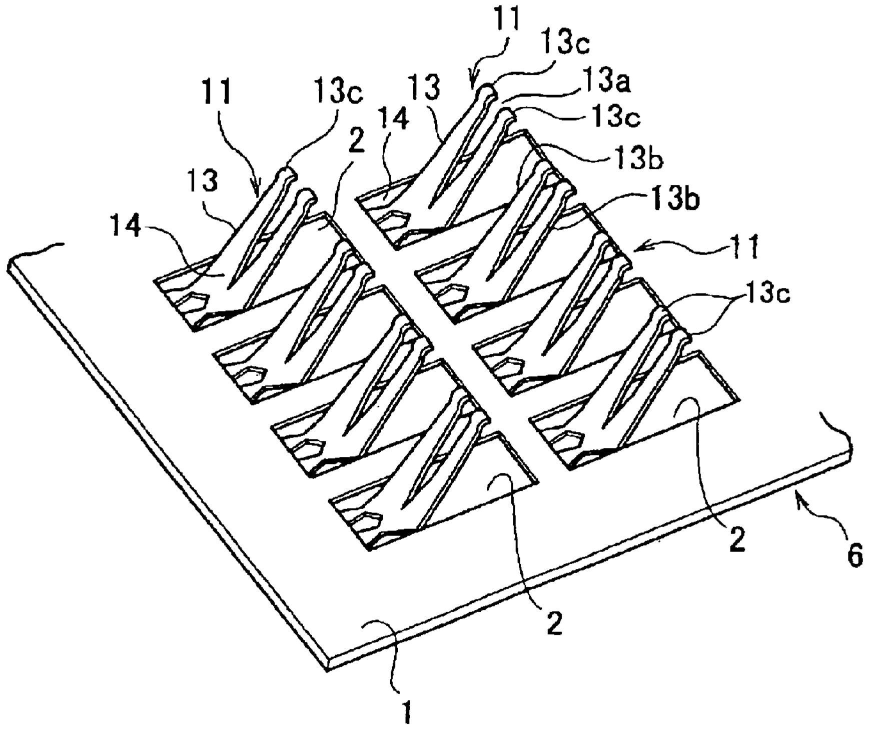
FIG. 3 is a perspective view showing a first bonded sheet.
Figure 4:
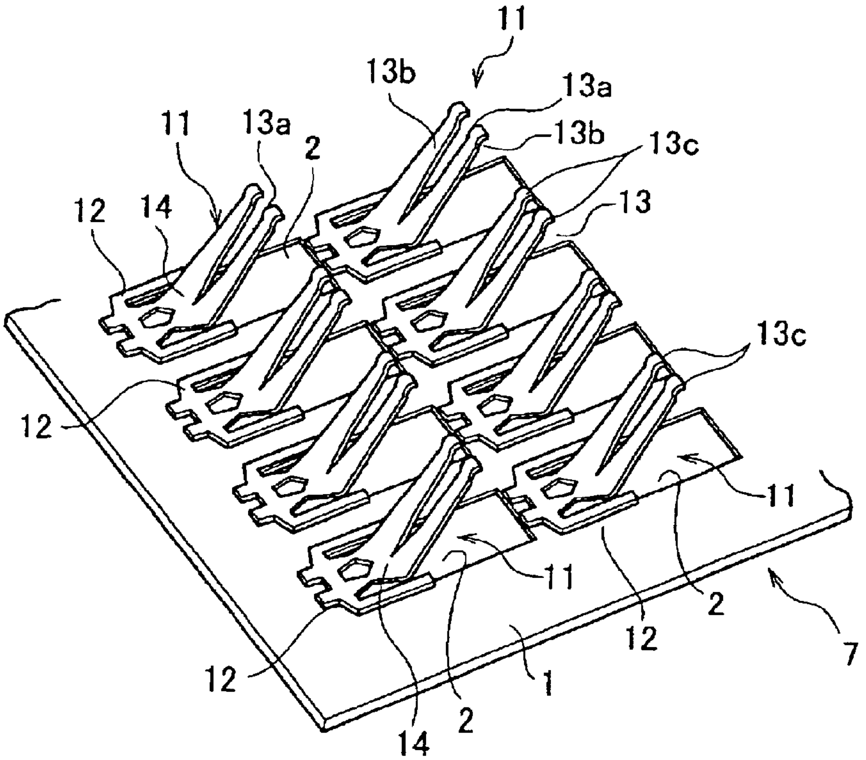
FIG. 4 is a perspective view showing a second bonded sheet.
Figure 5:
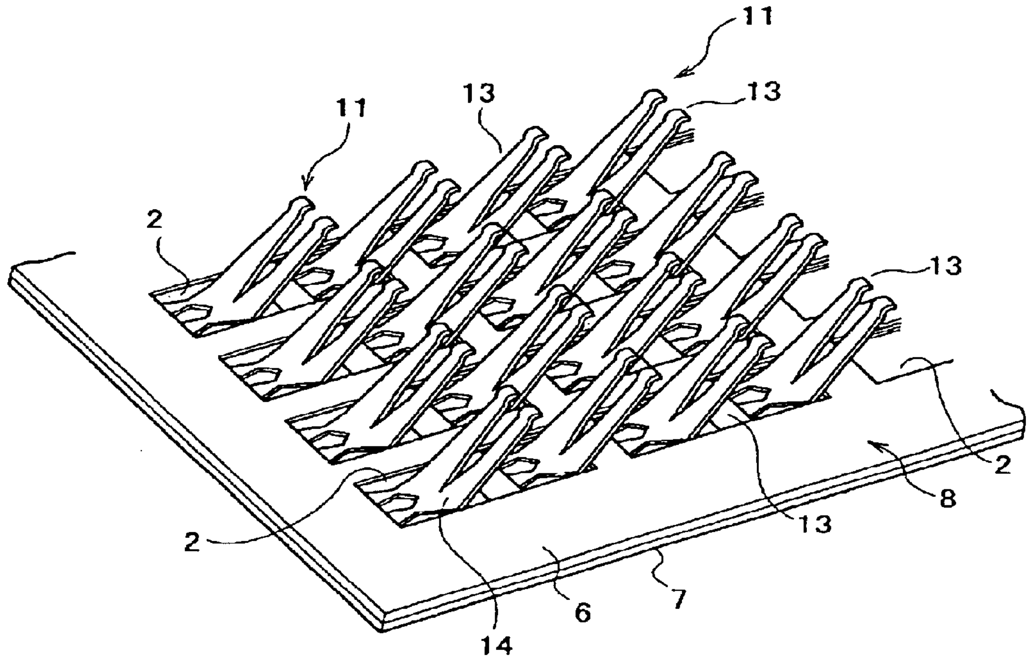
FIG. 5 is a perspective view showing a contact sheet in accordance with the first embodiment.
Figure 6:
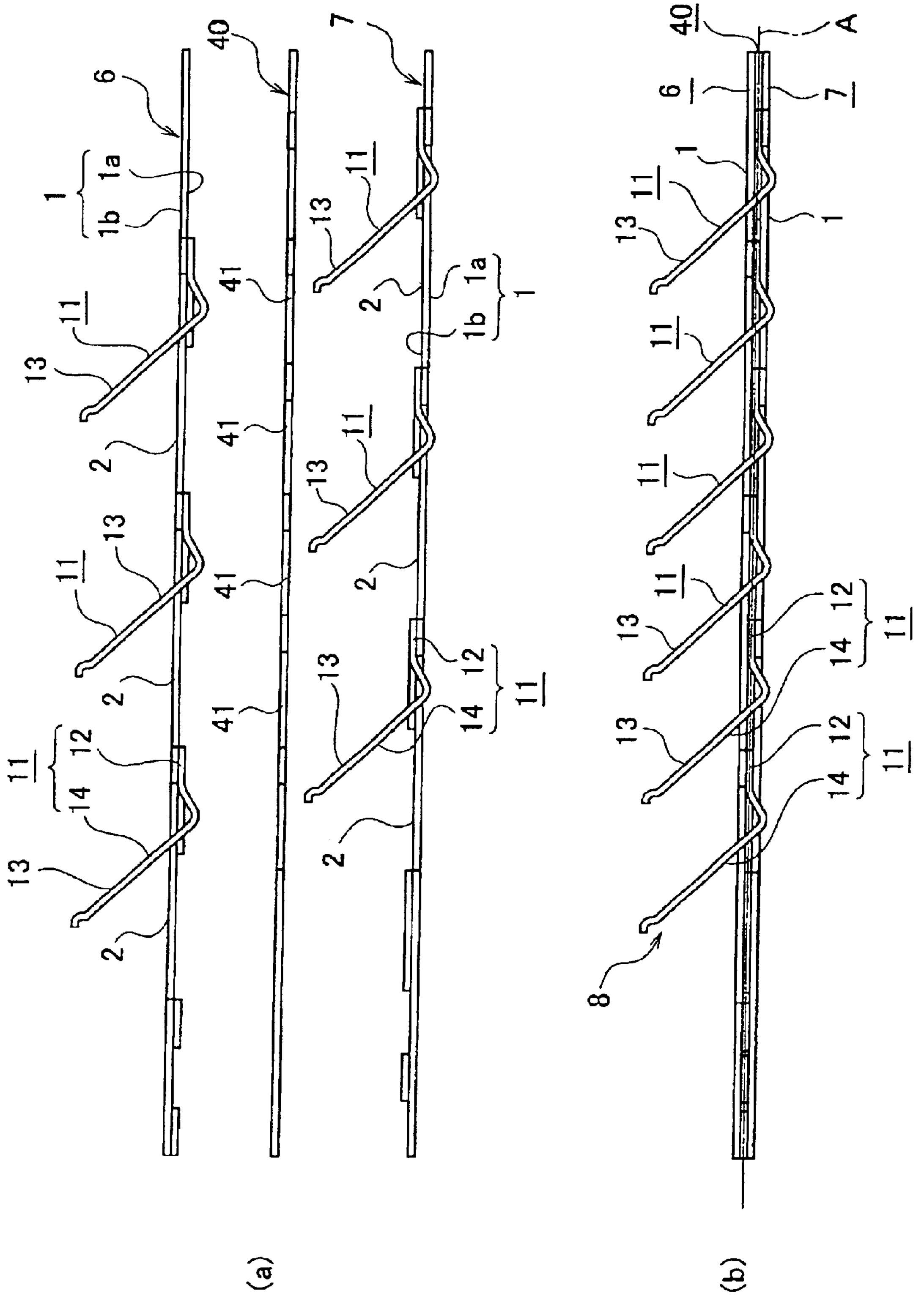
FIG. 6(*a*) shows a state before bonding in accordance with the first embodiment.

First Embodiment:

In FIGS. 1–6, the manufacturing process of a first embodiment of the present invention is shown. FIG. 1, FIGS. 2 and 3 and FIG. 4 respectively show the forming process of the base sheet, the forming process of the first bonded sheet, and the forming process of the second bonded sheet. FIG. 5 and FIG. 6 show a contact sheet and the bonding process for forming the contact sheet, respectively.

Figure 1:
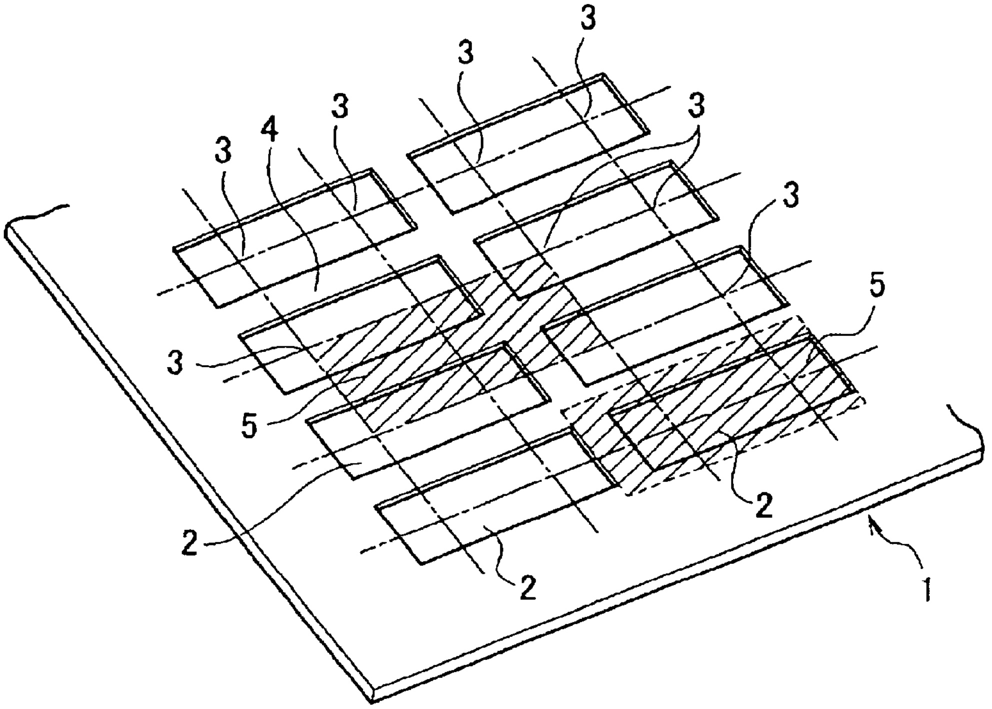
FIG. 1 is a perspective view showing a punched base sheet in accordance with one embodiment of the present invention.

The base sheet 1 is made of a polyimide film. As shown in FIG. 1, the base sheet 1 has a plurality of through-holes 2 formed therein in an arrayed pattern. The square measure of the area of the through-hole 2 and the fixed part 12 of the contact 11 (see FIG. 4) is greater than the unit grid area formed by the arrangement of terminals (not shown) of the electronic device. That is, the amount of the square measure of the through-hole 2 and the fixed part 12 is configured to be larger than that of the unit grid area.

In FIG. 1, the reference number 3 indicates a center position of a terminal of an electronic device, and the array of the centers 3 corresponds to the configuration of the terminal array of the electronic device. The unit grid 4 is a plane shape formed by a minimum number of centers 3. In the pattern shown, a rectangle whose four corners correspond to the positions of four of the centers 3 is the minimum unit comprising a unit grid 4. The area assigned to the through-hole 2 and the fixed part 12, that is the amount of the square measure of the through-hole 2 and the fixed part 12, is configured to be larger than the square measure of the unit grid 4.

In this embodiment, the square measure of the area of the through-hole 2 and the fixed part 12 is configured as twice the square measure of the unit grid 4. That is, the hatched area 5 in FIG. 1 represents the area of the through-hole 2 and the fixed part 12. The through-hole 2 is formed as a rectangle having a width corresponding to 1 unit of the grid length and a length corresponding to 2 units of the grid length. Before the through-holes are formed in the base sheet 1, an adhesive layer is formed to a thickness of 5–40 $\mu$m by coating. In this case, epoxy, imide, amide or another heat-resistive adhesive is available.

After the adhesive layer is coated, the plurality of through-holes 2 are formed in an array pattern at the same time by means of punching the base sheet 1. Laser cutting, etching with a photosensitive film or other cutting methods can also be applied to form the through-holes 2, as well. Furthermore, it is possible to form the adhesive layer after forming through-holes. Moreover, the shape of the through-hole is not restricted to a rectangle, and instead, a triangle, square, polygon, ellipse or another shape may also be suitable, as long as the above-mentioned dimensional conditions are satisfied.

Meanwhile, the contact 11 is formed from a metal sheet. The contacts are formed by means of etching or pressing the metal sheet. At this forming stage, adjacent contacts are not separated and all the contacts 11 are formed on a single metal contact sheet. The metal contact sheet A is bonded to the base sheet 1 shown in FIG. 1. Bonding is performed by arranging the metal contact sheet on the side of the base sheet 1 on which the adhesive layer is formed and thermocompression bonding the base sheet and the metal contact sheet together.

The moving part of the contact 11 is configured so that the total length of the second part 14 and the third contact portion 13 substantially corresponds to the full length of the through-hole 2. The second part 14 is partially bent so that the contact portion 13 is configured as a cantilever.

Figure 2:
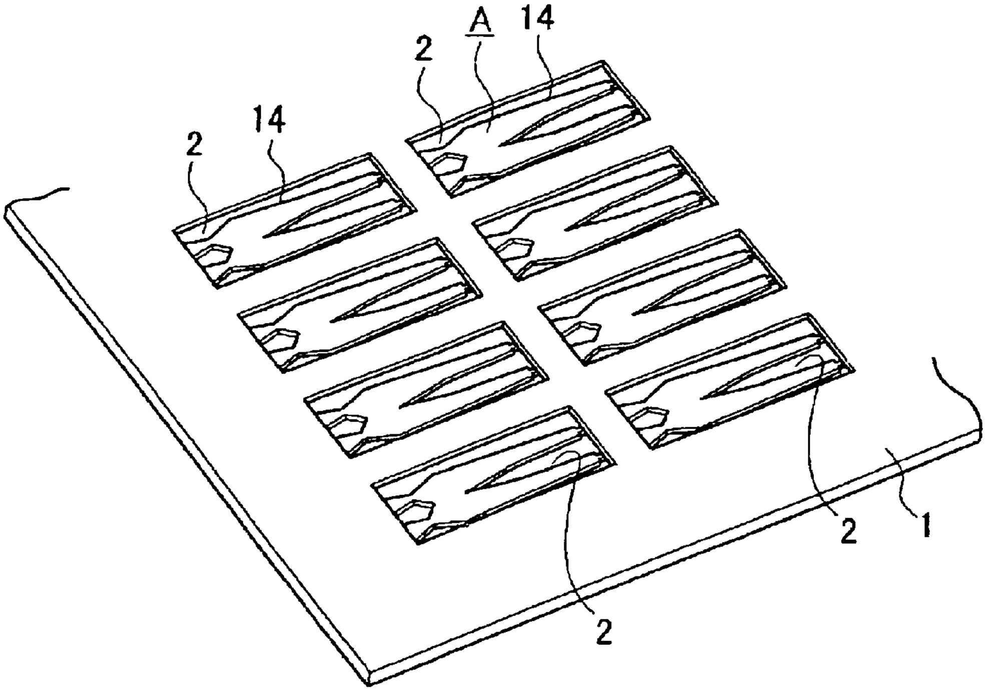
FIG. 2 is a perspective view showing the joining of the base sheet and the metal contact sheet.

FIGS. 2 and 3 show a metal contact sheet A bonded to the undersurface of the base sheet 1 to form a first bonded sheet 6. As shown in FIG. 3, the fixed part 12 is bonded to a part of the area surrounding the through-hole 2 such that the second part 14 and the contact portion 13 are positioned in the through-hole 2. In addition to the first bonded sheet 6 shown in FIG. 3, the state wherein the metal contact sheet is bonded to the upper surface of the base sheet 1 to form a second bonded sheet 7 is shown in FIG. 4. That is, in this embodiment, two bonded sheets are provided. One is the first sheet 6 shown in FIG. 3 where the metal contact sheet is bonded to the under surface of the base sheet 1, and the other is the second bonded sheet 7 shown in FIG. 4 where the metal contact sheet is bonded to the upper surface of the base sheet 1.

Then, each bonded sheet 6, 7 is pressed. This pressing singulates each contact 11, and the contact portion 13 of each contact 11 is raised elastically. The process of bending the second part 14 and the contact portion 13 is carried out so that the contact portion 13 constitutes an elastic cantilever extending from the second part 14. A portion of the second part 14 protrudes from one side of the bonded sheet 6, 7 through the through-hole 2, and the contact portion 13 extends away from the other side of the bonded sheet 6, 7.

Each contact 11 of both bonded sheets 6 and 7 is bent such that each contact portion 13 extends in the same direction irrespective of the side of the base sheet on which the adhesive surface is disposed, such that each contact portion 13 extends a distance from the same side (i.e., top or bottom) of each bonded sheet 6, 7.

The fixed part 12 of the contact 11 is bonded to the undersurface of the base sheet 1 in the first bonded sheet 6 in FIG. 3 and to the upper surface of the base sheet in the second bonded sheet 7 in FIG. 4. In these bonded sheets 6 and 7, the contact part 13 is raised in a slanted direction at an angle of about 45 degrees from the second part 14. The end of the contact portion 13 extended in the raised direction serves as a free end, and thereby, the contact portion 13 constitutes a cantilever.

In this embodiment, the fixed part 12 of each contact 11 is formed in a horseshoe shape along the peripheral edges of one end of the through-hole 2 and the contact portion 13 is raised up to extend out of the through-hole 2. This contact portion 13 includes a pair of legs **13*b* and 13*b* that are separated by a notch 13*a* formed in the longitudinal direction of the contact 11, and the arcuate contact points 13*c* are formed at the terminal ends of each leg 13*b* and 13*b*. The two contact points 13*c* of the contact 11** contact a terminal of an electronic device.

Next, the contact sheet 8 shown in FIG. 5 is produced by shifting the position of and bonding the bonded sheets 6 and 7. In this case, as shown in FIG. 6(*a*), the fixed part 12 of the contact 11 is bonded to the upper surface of the base sheet 1 of the second bonded sheet 7, and the fixed part 12 of the contact 11 is bonded to the undersurface in the first bonded sheet 6. The first bonded sheet 6 is stacked on the upper surface of the second bonded sheet 7, such that the first bonded sheet 6 covers the second bonded sheet 7 from above. By stacking the bonded sheets 6, 7 so that the contact portions 13 of each contact 11 in the second bonded sheet 7 pass through a portion of a respective through-hole 2 provided in the first bonded sheet 6, the contact portions 13 of the two bonded sheets 6 and 7 are disposed such that they extend away from the same surface of the contact sheet 8 in the same direction (FIG. 6(*b*)). The bonded sheets 6 and 7 are thus offset and arranged so that the contact portions 13 may be arranged in a position corresponding to the terminals of the electronic device. Furthermore, the two bonded sheets 6 and 7 are bonded via an adhesive sheet 40 having a plurality of through-holes 41 formed therethrough, as shown in FIG. 6(*a*), which enables certain and firm bonding.

In the contact sheet 8 produced by the above-mentioned method, the fixed parts 12 of both bonded sheets 6 and 7 are disposed in a substantially coplanar arrangement on a plane of the metal contact sheet A between the two bonded sheets 6 and 7, as shown in FIG. 6(*b*). Moreover, the contact portions 13 can contact a plurality of terminals for a plurality of electronic devices because the contact portions 13 of each bonded sheet 6 or 7 extend from the same side of the contact sheet 8.

In the contact sheet 8 in accordance with this embodiment, although the total area of the fixed part 12 of the contact 11 and the through-hole 2 in the base sheet 1 is larger than the square measure of the unit grid 4, the moving part can be configured to be long because the length of the through-hole 2 is relatively long. Accordingly, the contact portions 13 formed by bending the second part 14 can also be configured to be long. Therefore, even if the terminal pitch of the electronic device is narrow, the contact portion 13 can be satisfactorily bent and can effectively absorb the deformation.

In addition, since the fixed part 12 can be configured to be larger according to the size of the through-hole 2, the contact portion 13 supported by the second part 14 and the fixed part 12 as a cantilever exhibits increased elasticity. For this reason, the contact portion 13 can contact the terminal of an electronic device with a large contact load, and the resistance is reduced.

Figure 7:
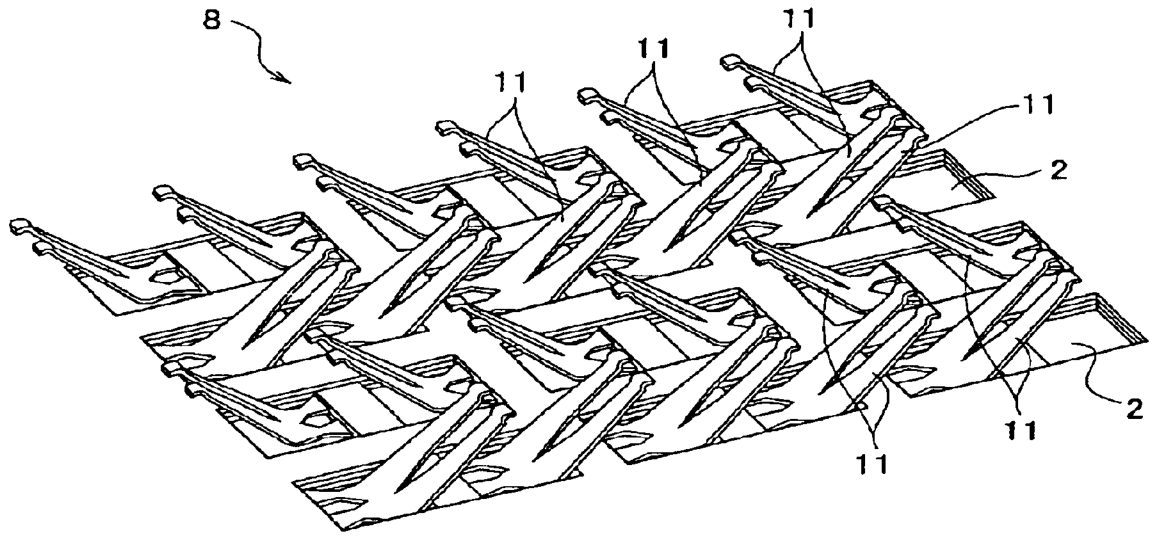
FIG. 7 is a perspective view showing an optional example for a main part of a contact sheet in accordance with the first embodiment.

Moreover, as shown in FIGS. 5 and 6, although the longitudinal direction of the contact 11 is arranged along the grid direction of the arrangement of the terminals 3 of the electronic device, the longitudinal direction of the contact 11 may be arranged along the aslant direction of the grid (26–45 degrees). Moreover, as shown in FIG. 7, the direction in which the contacts 11 extend away from the contact sheet 8 may be arranged in a reverse direction with respect to a neighboring contact 11.

Figure 8:
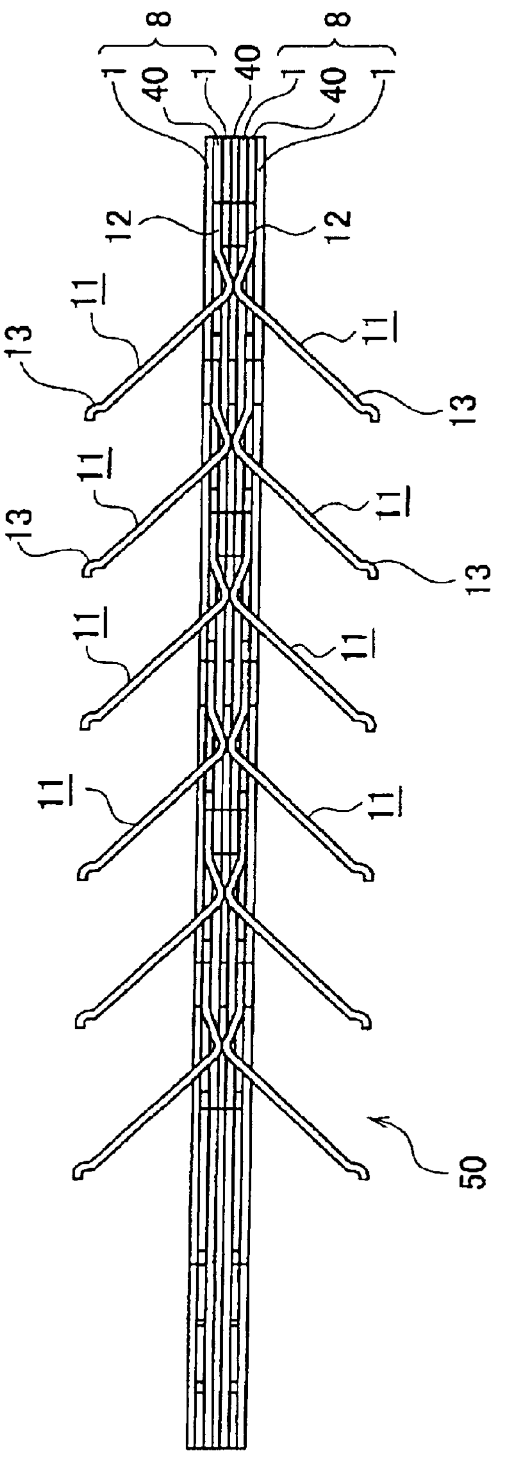
FIG. 8 is a cross-sectional view showing another example of a contact sheet in accordance with the first embodiment.

Furthermore, two of the contact sheets 8 are bonded back to back to form another contact sheet 50, as shown in FIG. 8. In this case, each contact sheet 8 constitutes bonded sheets 6 and 7 as materials. The bonding to form the contact sheet 50 can be carried out via an adhesive sheet that has through-holes formed therethrough as shown in FIG. 1. Thus, by bonding two contact sheets 8 back to back through an adhesive sheet 40 that has a corresponding arrangement of through-holes 41, such as the structure shown in FIG. 6(*a*), a contact sheet 50 in which contact portions 13 extend in both the upward and downward directions and which has twice as many contact portions 13 can be produced.

The contact sheet 50 having contact portions 13 extending from the upper and lower surfaces thereof as shown in FIG. 8 can be inserted between two electronic devices. By so inserting the contact sheet 50, contact portions 13 corresponding to the upper and lower surfaces of the contact sheet 50 contact the opposed terminals of two electronic devices respectively. This enables conduction between the corresponding terminals of the electronic devices because each contact portion is sufficiently displaced even if the terminal pitch is very small and if the distance between electronic devices is very large.

Figure 9:
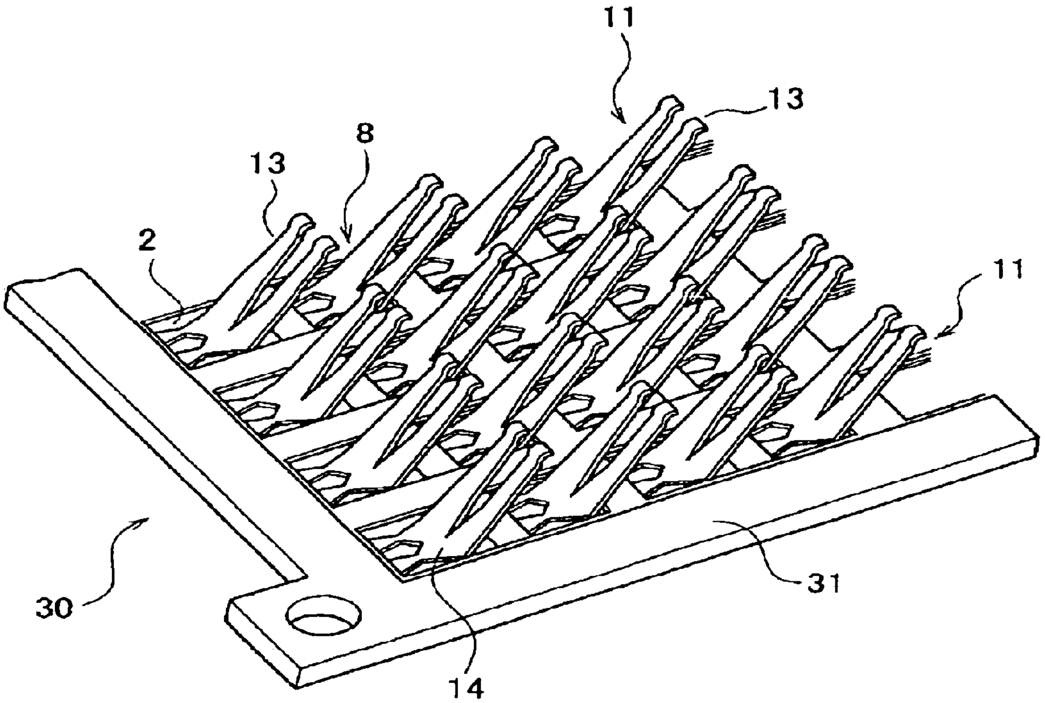
FIG. 9 is a perspective view showing a socket in accordance with the first embodiment.
Figure 10:
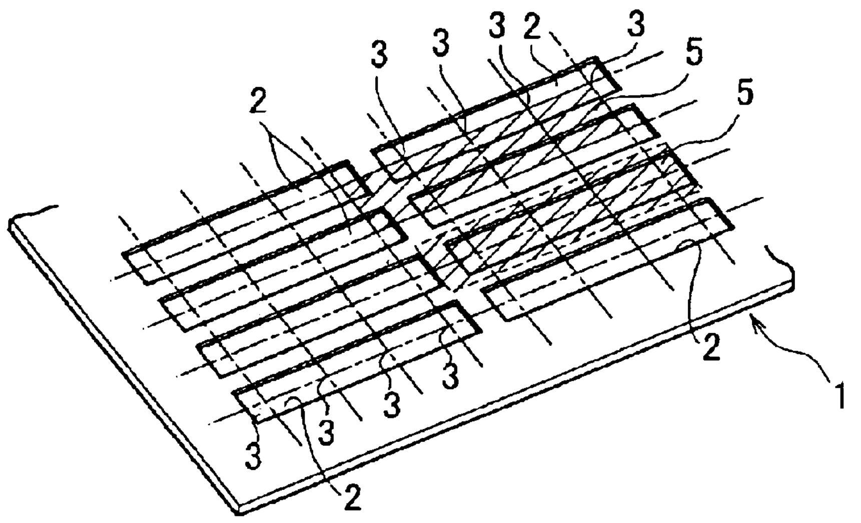
FIG. 10 is a perspective view showing a base sheet according to a second embodiment of the present invention.

FIG. 9 shows a socket 30 including a contact sheet 8 according to one embodiment of the present invention. The socket 30 comprises the contact sheet 8 and a frame 31 in which the contact sheet 8 is installed. As shown, the frame 31 is formed in the shape of a planar rectangle or square made of a resin, such as ABS, polypropylene, PEFK, PBT or PES, or of a metal, such as iron, iron alloy, aluminum, aluminum alloy or stainless steel. The frame 31 holds the contact sheet 8 in the pressed state. The contact sheet 8 is installed in the frame 31 by appropriate means of adhesion, insertion or injection molding by inserting the contact sheet 8 into the die and so on. Since the frame 31 reinforces the socket 30, the socket has wear resistance and sufficient endurance for repetitive use.

Second Embodiment:

FIGS. 10–14 show a contact sheet in accordance with a second embodiment of this invention. In this embodiment, a through-hole 2 is formed in a base sheet 1 in a predetermined pattern and configured to correspond to a rectangle consisting of four contiguous unit grids which are formed by an arrangement of the terminals of an electronic device, which is shown as the hatched area 5 in FIG. 10. The through-hole 2 is formed by punching, laser cutting, etching with photosensitive film or any other suitable cutting method. An adhesive layer is formed on one side of the base sheet 1 by coating, either before or after forming the through-hole 2.

Meanwhile, a metal contact sheet consisting of a plurality of adjacent contacts connected to one another is produced by etching or punching a metal sheet as described above with respect to the first embodiment. In this metal contact sheet, a fixed part of the contact is configured so that the area overlapping the edge portion of the through-hole 2 fits within the four unit grids. The moving part, including the second part 14 and the third contact portion 13, has a length that substantially corresponds to the length of the through-hole 2 is contiguous with the fixed part.

Figure 11:
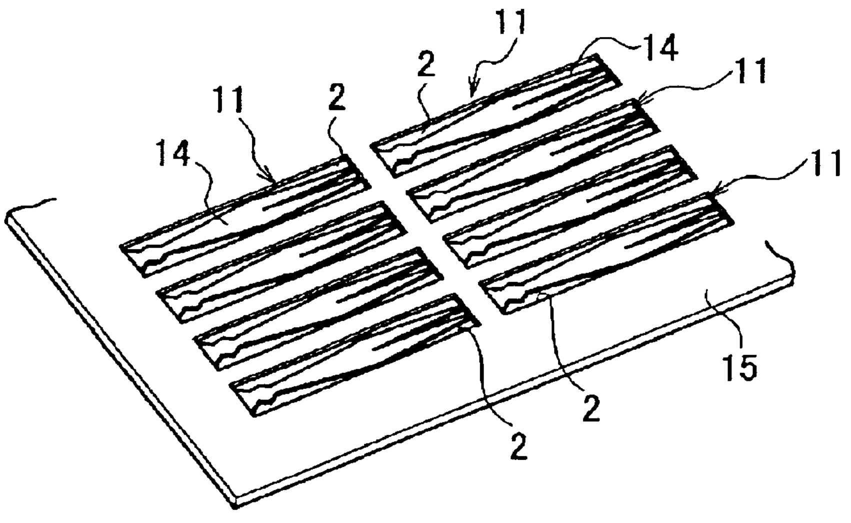
FIG. 11 is a perspective view showing the joining of the punched metal sheet and the base sheet according to the second embodiment.
Figure 12:
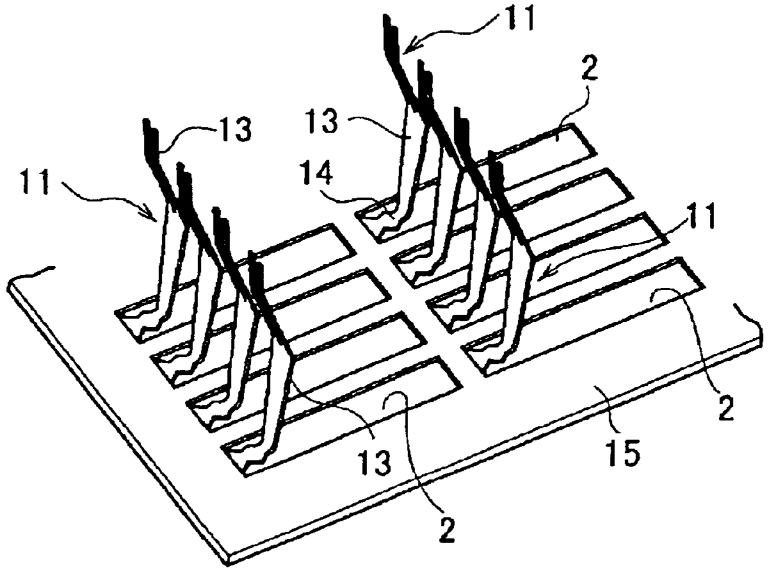
FIG. 12 is a perspective view showing a contact sheet according to the second embodiment in which contacts are formed.

FIG. 11 shows the above metal contact sheet disposed under a base sheet 1 and bonded by thermo-compression bonding to form a bonded sheet 15. Next, the bonded sheet 15 is pressed to separate the contacts 11 from the metal contact sheet so that each contact 11 is isolated independently, and such that the second part 14 is bent and contact portion 13 of each contact 11 is raised elastically from the second part 14. In this embodiment, the contact portion 13 is raised almost vertically, as shown in FIG. 12.

Figure 13:
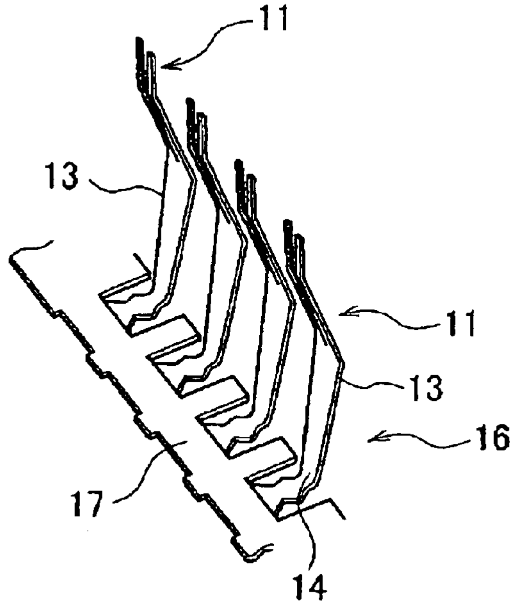
FIG. 13 is a perspective view showing the contact units according to the second embodiment.

After this raising, the bonded sheet 15 is cut along the row line of the contact portions 13 to form a plurality of contact units 16. FIG. 13 shows a contact unit 16 produced by this cutting. In the contact unit 16, only a part of the bonded sheet 15 that is fixed to the contact 11 remains, and, for this reason, the residual part of the bonded sheet 15 comprises a comb-like base piece 17. That is, in each contact unit, the contacts 11 are bonded to the under surface of the comb-like base piece 17 at the fixed parts and the contact portions 13 extend almost vertically from the comb-like base piece 17.

Figure 14:
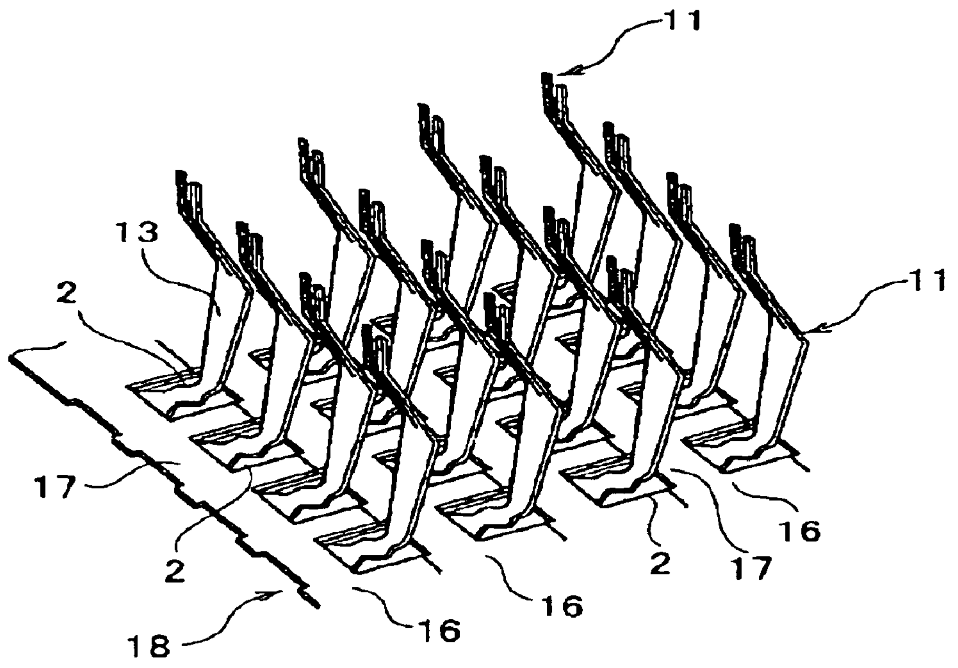
FIG. 14 is a perspective view showing a contact sheet in accordance with the second embodiment.

Next, the above contact units 16 are arranged side by side on a second insulative base sheet (not shown) that has a plurality of through-holes corresponding to the terminals of the electronic device, and bonded to produce the contact sheet 18 shown in FIG. 14. That is, after forming an adhesive layer on the upper surface of the second base sheet, the contact units 16 are arranged in order and bonded to the upper surface of the second base sheet by thermo-compression bonding. In this case, adjacent base pieces 17 are arranged parallel to each other, and the contact portions 13 extend upwardly in an array from the second base sheet. The fixed part of the contact 11 is interposed and fixed between the second base sheet and the base piece 17, and the contact portion 13 extends as a cantilever.

Therefore, the contact portion 13 can be configured to be long, and even if the terminal pitch of the electronic device is narrow, sufficient displacement can be achieved and any deformation or warp can be absorbed. Furthermore, because the fixed part can be configured to be large as described above with respect to the first embodiment, the contact portion 13 can contact the terminal of the electronic device with a large contact load and the electrical resistance can be stabilized.

Also, two of the contact sheets 18 as shown in FIG. 14 can be bonded together back to back, and accordingly, a contact sheet that has the contact portions 13 extending both upwardly and downwardly can be produced (for example, see a similar structure shown in FIG. 8). The contact sheet having the above structure can be positioned between two electronic devices such that the contact portions 13 on both sides of the contact sheet connect to terminals of two or more electronic devices to enable conduction between the terminals of the electronic devices.

Moreover, if the contact sheet 18 is disposed inside a frame, a socket can be formed according to this embodiment, as well.

Third Embodiment:

FIGS. 15–18 show a contact sheet in accordance with a third embodiment of the present invention.

Figure 15:
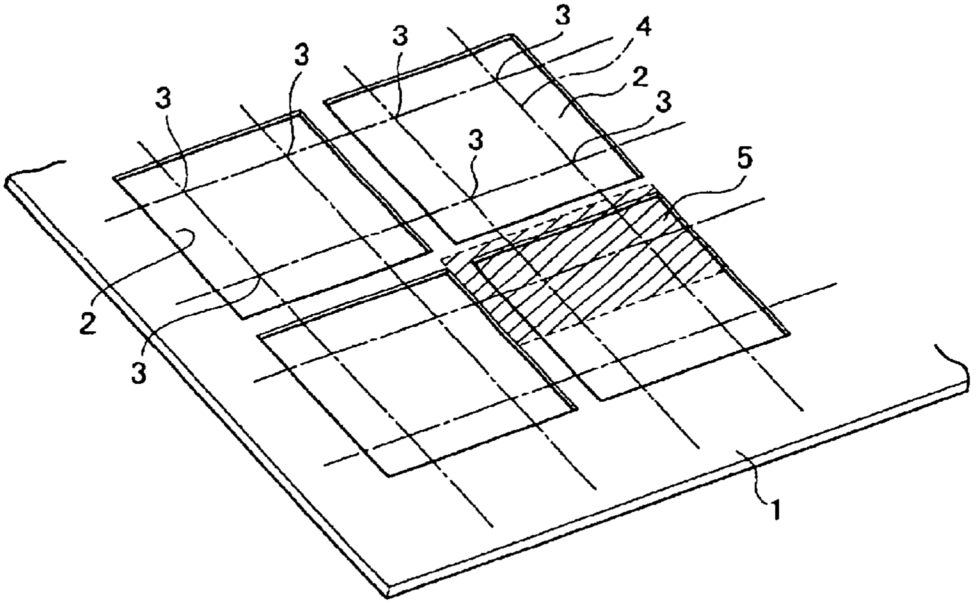
FIG. 15 is a perspective view showing a preferred punched base sheet according to a third embodiment of the present invention.

In this embodiment, the through-hole 2 is configured as a square having a size that corresponds to a square consisting of four unit grids 4 which are formed by an arrangement of the terminals of an electronic device as shown in FIG. 15. Accordingly, the length of a side of the square through-hole 2 corresponds to twice the length of the side of the unit grid 4. Adopting such dimensions not only makes it easy to form the through-hole 2 but also enlarges the square measure width of a contact to be disposed therein and enables a corresponding increase in spring load.

Figure 16:
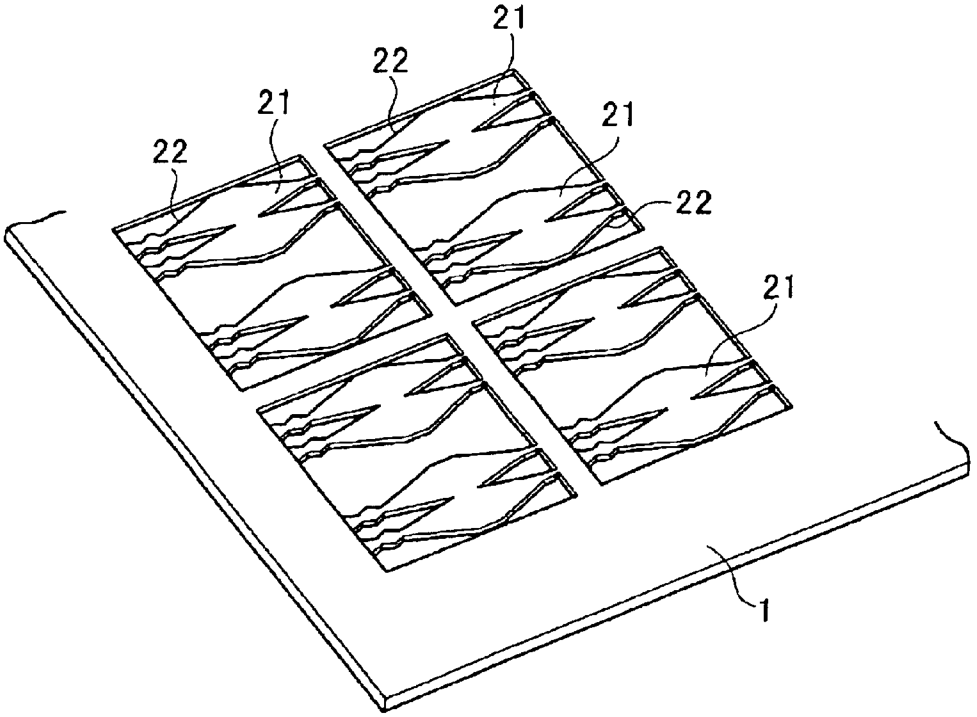
FIG. 16 is a perspective view showing the joining of the base sheet and the metal sheet according to the third embodiment.
Figure 17:
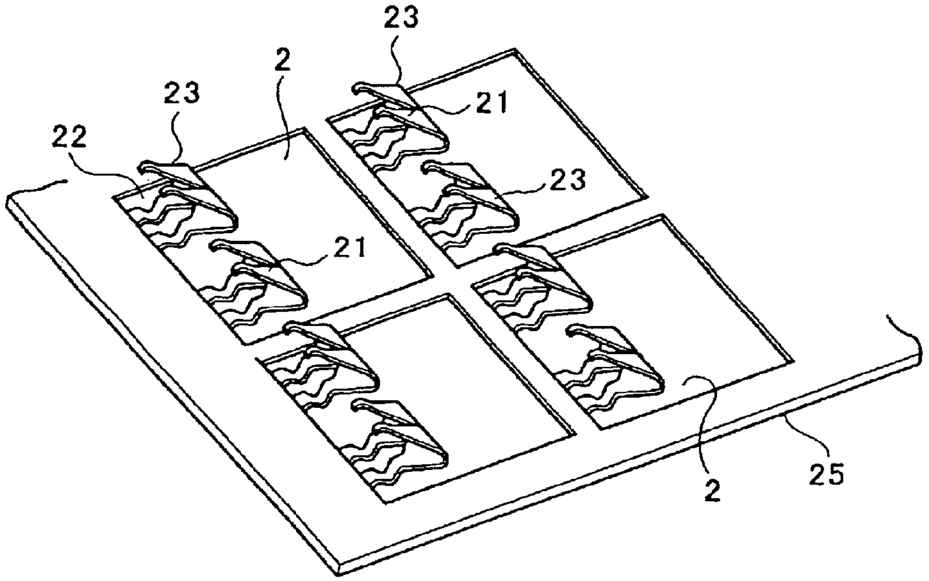
FIG. 17 is a perspective view showing a contact sheet of the third embodiment in which contacts are formed.

FIG. 16 shows a base sheet 1 bonded with a metal contact sheet comprising a plurality of contacts 21. Each contact 21 comprises a fixed part (not shown) and a moving part including a second part 22 contiguous with the fixed part and a third contact portion 23 contiguous with the second part. The fixed part is fixed to a portion of one or more peripheral sides of the through-hole 2 in the base sheet 1. Meanwhile, the moving part has a length that substantially corresponds to the overall length of the through-hole 2. In his embodiment, two contacts 21 are disposed in one through-hole 2, and therefore, two moving parts are positioned inside the single through-hole 2 as shown in FIG. 16. The manufacturing process steps shown in FIGS. 15–17 are carried out as described above with respect to the first embodiment. Furthermore, by disposing the contact sheet 25 inside of a frame, a socket may be produced in this embodiment also.

FIG. 17 also shows a bonded sheet 25 including contact portions 23 formed by singulating each contact 21 from the state shown in FIG. 16 and bending each contact 21 such that the second part 22 and contact portion 23 forms a C shape.

Figure 18:
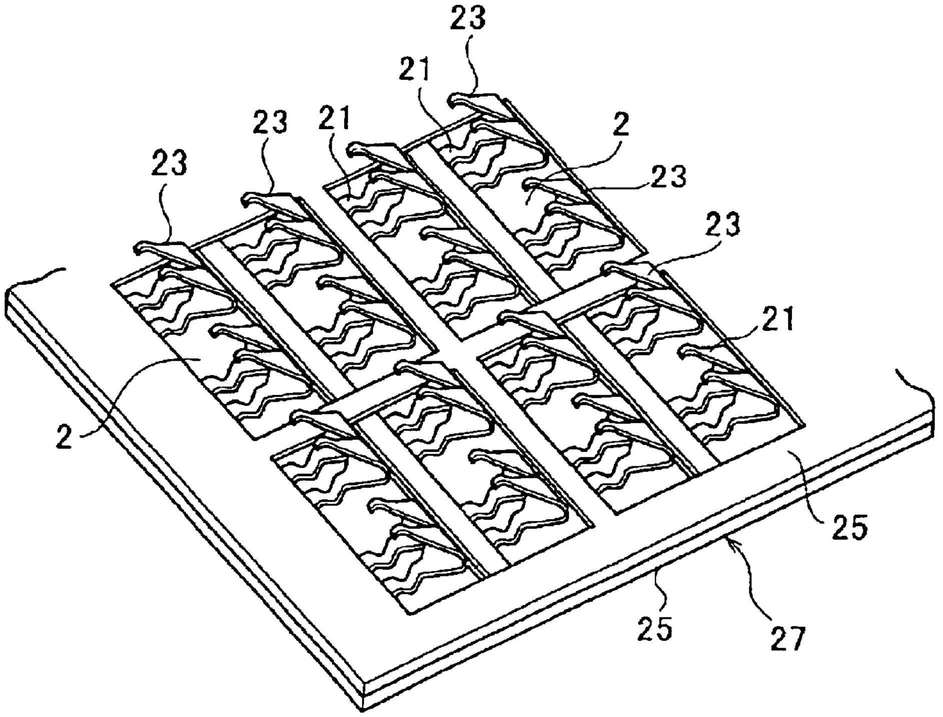
FIG. 18 is a perspective view showing a contact sheet according to the third embodiment.

FIG. 18 shows two bonded sheets 25 that are stacked and bonded. The two stacked, bonded sheets 25, in which each contact portion 23 protrudes in the same direction, are offset by a distance that is about one half of the through-hole interval so that each contact portion 23 faces a corresponding terminal of the electronic device to produce a contact sheet 27 in accordance with this embodiment. In the above-mentioned bonding procedure, a total of 4 contacts 21, arranged in 2 rows by 2 columns, are positioned in the area of a single through-hole 2. In addition, the contact sheet 27 shown in FIG. 18 can be produced in the same manner as described above with respect to the first embodiment.

The above embodiment has similar functions and effects as the first embodiment. Furthermore, because the through-hole 2 corresponds to the area of four unit grids, and because its shape is square and its width is wide, it becomes easier to form the through-hole 2 and to offset and stack two of the bonded sheets 25. Moreover, the width of the contact 21 is extended by widening a frame of the through-hole and the spring load can be enlarged. Therefore, more stable electrical connections can be provided.

Also, two of the contact sheets 27 shown in FIG. 18 can be bonded back to back each other, and accordingly, a contact sheet having contact portions that extend both upwardly and downwardly can be produced. Consequently, a contact sheet in which contact portions 23 on both sides of the contact sheet connect to the respective terminals of two or more electronic devices is provided.

While the present invention has been particularly shown and described with reference to the preferred mode as illustrated in the drawings, it will be understood by one skilled in the art that various changes in detail may be effected therein without departing from the spirit and scope of the invention defined by the claims.

What is claimed is:

1. A contact sheet, comprising:

a first insulating base sheet having a plurality of through-holes formed therein in an array pattern;

a second insulating base sheet having a plurality of through-holes formed therein in an array pattern that is laminated to said first insulating base sheet, wherein a first surface of said contact sheet is defined by one of said first and said second insulating base sheets and an opposed second surface of said contact sheet is defined by the other of said first and said second insulating base sheets; and a plurality of conductive contacts arranged between said first base sheet and said second base sheet, each said conductive contact comprising a first portion disposed and fixed between said first and said second base sheets in a position proximate an edge portion of a respective one of said through-holes such that each said first portion of each said conductive contact is substantially coplanar, an integral second portion extending a distance from said first portion in a length direction of said through-hole and protruding from said first surface of said contact sheet, and an integral third portion extending from said second portion and protruding from said second surface of said contact sheet such that each said third portion of each said conductive contact comprises an elastic cantilever contact portion;

wherein a total area of said first portion of said conductive contact and a respective one of said through-holes is greater than a unit grid area formed by an arrangement of terminals of an electronic device; and wherein a total length of said second portion and said third portion of each said conductive contact substantially corresponds to a length of said through-holes;

whereby the terminals of a plurality of electronic devices are connected via said conductive contacts of said contact sheet when said contact sheet is interposed therebetween.

2. The contact sheet of claim 1, wherein said total area of said first portion of said conductive contact and said through-hole is an integral multiple of said unit grid area.

3. The contact sheet of claim 1, wherein at least two of said conductive contacts are disposed in a single one of said through-holes.

4. A bonded contact sheet comprising first and second contact sheets according to claim 1, wherein said first surface of said first contact sheet and said first surface of said second contact sheet are bonded to each other.

5. A socket comprising:

a frame; and a contact sheet according to claim 1 disposed within a boundary defined by said frame.

6. A socket comprising:

a frame; and a contact sheet according to claim 4 disposed within a boundary defined by said frame.

7. A contact sheet, comprising:

a first insulating base sheet having a plurality of through-holes formed therein in an array pattern, said first base sheet having a first surface and an opposed second surface;

a first group of conductive contacts bonded to said second surface of said first base sheet, wherein each said conductive contact of said first group comprises a first portion disposed and fixed on said second surface of said first base sheet in a position proximate an edge portion of a respective one of said through-holes of said first base sheet such that each said first portion of each said conductive contact is substantially coplanar, an integral second portion extending a distance from said first portion in a length direction of said through-hole and having at least a portion protruding from said second surface of said first base sheet, and an integral third portion extending from said second portion and protruding from said first surface of said first base sheet such that each said third portion of each said conductive contact comprises an elastic cantilever contact portion;

a second insulating base sheet having a plurality of through-holes formed therein in an array pattern, said second base sheet having a first surface and an opposed second surface; and a second group of conductive contacts bonded to said second surface of said second base sheet, wherein each said conductive contact of said second group comprises a first portion disposed and fixed on said second surface of said second base sheet in a position proximate an edge portion of a respective one of said through-holes of said second base sheet such that each said first portion of each said conductive contact is substantially coplanar, an integral second portion extending a distance from said first portion in a length direction of said through-hole and having at least a portion protruding from said first surface of said second base sheet, and an integral third portion extending from said second portion and protruding from said second surface of said second base sheet such that each said third portion of each said conductive contact comprises an elastic cantilever contact portion;

wherein said second surface of said first insulating base sheet is joined to said second surface of said second insulating base sheet such that said array patterns of said first and said second base sheets are arranged and spaced in a staggered manner at a predetermined pitch with respect to one another to form said contact sheet having a first surface defined by said first surface of said first insulating base sheet and an opposed second surface defined by said first surface of said second insulating base sheet;

wherein at least a portion of said first portion of each said contact of said first and said second groups is interposed between said second surfaces of said first and said second base sheets, such that each said first portion of said contacts of said first group is substantially coplanar with each said first portion of said contacts of said second group;

wherein at least a portion of said second portion of each said contact of said first and said second groups protrudes from said second surface of said contact sheet; and wherein each said third portion of each said contact of said second group passes through a respective through-hole in said first insulating base sheet, protrudes from said first surface of said contact sheet and is interposed between adjacent third portions of said contacts of said first group protruding from said first surface of said contact sheet.

* * * * *